(12) United States Patent
Jung et al.

(10) Patent No.: US 11,432,396 B2
(45) Date of Patent: Aug. 30, 2022

(54) PRINTED CIRCUIT BOARD AND ANTENNA MODULE COMPRISING THE SAME

(71) Applicant: SAMSUNG ELECTRO-MECHANICS CO., LTD., Suwon-si (KR)

(72) Inventors: Myeong Hui Jung, Suwon-si (KR); Kwang Yun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 166 days.

(21) Appl. No.: 16/864,741

(22) Filed: May 1, 2020

(65) Prior Publication Data

US 2021/0274646 A1 Sep. 2, 2021

(30) Foreign Application Priority Data

Mar. 2, 2020 (KR) .................. 10-2020-0025825

(51) Int. Cl.
*H05K 1/02* (2006.01)
*H05K 1/11* (2006.01)
*H01Q 1/38* (2006.01)

(52) U.S. Cl.
CPC .......... *H05K 1/0219* (2013.01); *H01Q 1/38* (2013.01); *H05K 1/0278* (2013.01); *H05K 1/115* (2013.01); *H05K 1/118* (2013.01); *H05K 2201/0723* (2013.01); *H05K 2201/09609* (2013.01); *H05K 2201/10098* (2013.01)

(58) Field of Classification Search
CPC .............. H05K 1/0216; H05K 1/0228; H05K 2201/093; H05K 1/0278; H05K 1/148; H05K 2201/058

See application file for complete search history.

(56) References Cited

U.S. PATENT DOCUMENTS

| 6,353,189 | B1 | 3/2002 | Shimada et al. | |
| 2005/0104191 | A1* | 5/2005 | Jow | H05K 1/162 |
| | | | | 257/698 |
| 2007/0119541 | A1* | 5/2007 | Kawabata | H05K 3/0058 |
| | | | | 156/307.7 |

(Continued)

FOREIGN PATENT DOCUMENTS

| JP | H07-99397 A | 4/1995 |
| JP | 3687041 B2 | 8/2005 |

(Continued)

*Primary Examiner* — Steven T Sawyer
(74) *Attorney, Agent, or Firm* — Morgan, Lewis & Bockius LLP

(57) ABSTRACT

The present disclosure relates to a printed circuit board and a module including the same. The printed circuit board includes an insulating body, a wiring pattern embedded in the insulating body, and a first conductor pattern disposed on the insulating body and overlapping at least a portion of the wiring pattern in a first direction. First conductive vias each penetrate a portion of the insulating body and are respectively disposed on opposite sides of the wiring pattern, in a second direction orthogonal to the first direction, to surround at least a portion of the wiring pattern. Each first conductive via has a first surface connected to the first conductor pattern, and a second surface, opposite to the first surface, connected to the insulating body.

23 Claims, 6 Drawing Sheets

(56) References Cited

U.S. PATENT DOCUMENTS

| | | | |
|---|---|---|---|
| 2015/0034364 A1* | 2/2015 | Ho | H05K 1/0215 |
| | | | 174/251 |
| 2015/0305142 A1* | 10/2015 | Matsuda | H01P 3/082 |
| | | | 29/601 |
| 2017/0027054 A1* | 1/2017 | Hu | H05K 1/0242 |
| 2017/0250466 A1* | 8/2017 | Schlatter | H05K 1/185 |
| 2018/0146543 A1* | 5/2018 | Chen | H05K 1/05 |
| 2019/0008033 A1* | 1/2019 | Chung | H05K 3/422 |
| 2019/0116664 A1* | 4/2019 | Krivec | H05K 3/4691 |
| 2020/0178389 A1 | 6/2020 | Min et al. | |
| 2020/0178401 A1 | 6/2020 | Min et al. | |
| 2020/0267831 A1* | 8/2020 | Koyama | H05K 1/0219 |
| 2021/0028539 A1* | 1/2021 | We | H01Q 21/28 |
| 2021/0076492 A1 | 3/2021 | Min et al. | |
| 2021/0168935 A1* | 6/2021 | Lin | H01L 23/66 |

FOREIGN PATENT DOCUMENTS

| | | |
|---|---|---|
| KR | 10-2020-0007308 A | 1/2020 |
| KR | 10-2020-0008389 A | 1/2020 |
| KR | 10-2020-0013471 A | 2/2020 |
| KR | 10-2020-0067613 A | 6/2020 |
| KR | 10-2020-0067621 A | 6/2020 |
| KR | 10-2021-0031304 A | 3/2021 |

* cited by examiner

PRINTED CIRCUIT BOARD AND ANTENNA MODULE COMPRISING THE SAME

CROSS-REFERENCE TO RELATED APPLICATION(S)

This application claims benefit of priority to Korean Patent Application No. 10-2020-0025825 filed on Mar. 2, 2020 in the Korean Intellectual Property Office, the disclosure of which is incorporated herein by reference in its entirety.

BACKGROUND

1. Field

The present disclosure relates to a printed circuit board and a module comprising the same.

2. Description of Related Art

Data traffic for mobile communications is increasing rapidly every year. Technological development is underway to support the transmission of such rapidly increased data in real time in wireless networks. For example, the contents of internet of things (IoT) based data, augmented reality (AR), virtual reality (VR), live VR/AR combined with SNS, autonomous navigation, applications such as Sync View (real-time video user transmissions using ultra-small cameras), and the like may require wireless communications (e.g., 5G communications, mmWave communications, etc.) supporting the transmission and reception of large amounts of data. Therefore, recently, millimeter wave (mmWave) communication including $5^{th}$ generation (5G) has been actively researched, and research into the commercialization and standardization of antenna modules for smoothly implementing the same has been also actively conducted. Meanwhile, radio frequency (RF) signals in a high frequency band (for example, 28 GHz, 36 GHz, 39 GHz, 60 GHz, etc.) may be damaged by electromagnetic interference (EMI) due to electromagnetic noise between adjacent circuits during transmission of the RF signals.

SUMMARY

An aspect of the present disclosure is to provide a printed circuit board capable of EMI shielding for a wiring pattern and a module comprising the same.

Another aspect of the present disclosure is to provide a printed circuit board, which can prevent via cracks even when a substrate is bent, and a module including the same.

Another aspect of the present disclosure is to provide a printed circuit board that can reduce signal loss by suppressing generation of static electricity and a module including the same.

An aspect of the present disclosure is to shield EMI of a wiring pattern by forming a conductor pattern and a conductive via around the wiring pattern.

Another aspect of the present disclosure is that one end of the conductive via is connected to an insulating body to be disconnected from the conductor pattern.

According to an aspect of the printed circuit board, a printed circuit board includes an insulating body, a wiring pattern embedded in the insulating body, and a first conductor pattern disposed on the insulating body and overlapping at least a portion of the wiring pattern in a first direction. First conductive vias each penetrate a portion of the insulating body, and are respectively disposed on opposite sides of the wiring pattern, in a second direction orthogonal to the first direction, to surround at least a portion of the wiring pattern. Each first conductive via has a first surface connected to the first conductor pattern, and a second surface, opposite to the first surface, connected to the insulating body.

According to an aspect of the present disclosure, a module includes a printed circuit board having a rigid region and a flexible region connected to the rigid region, and an electronic component mounted on the rigid region. The flexible region includes an insulating body, a wiring pattern embedded in the insulating body, a conductor pattern disposed on the insulating body, and conductive vias penetrating a portion of the insulating body, each conductive via having one surface connected to the conductor pattern and another surface connected to the insulating body. The conductor pattern and the conductive vias surround at least a portion of the wiring pattern.

According to a further aspect of the present disclosure, a printed circuit board includes an insulating body, a wiring pattern embedded in the insulating body, and first and third conductor patterns disposed on respective surfaces of the insulating body above and below the wiring pattern. First conductive vias extend downward from the first conductor pattern on opposite sides of the wiring pattern, and a lower end of each first conductive via is embedded exclusively in the insulating body to be spaced apart from the wiring pattern and all conductor patterns and conductive vias.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

Figure 1:
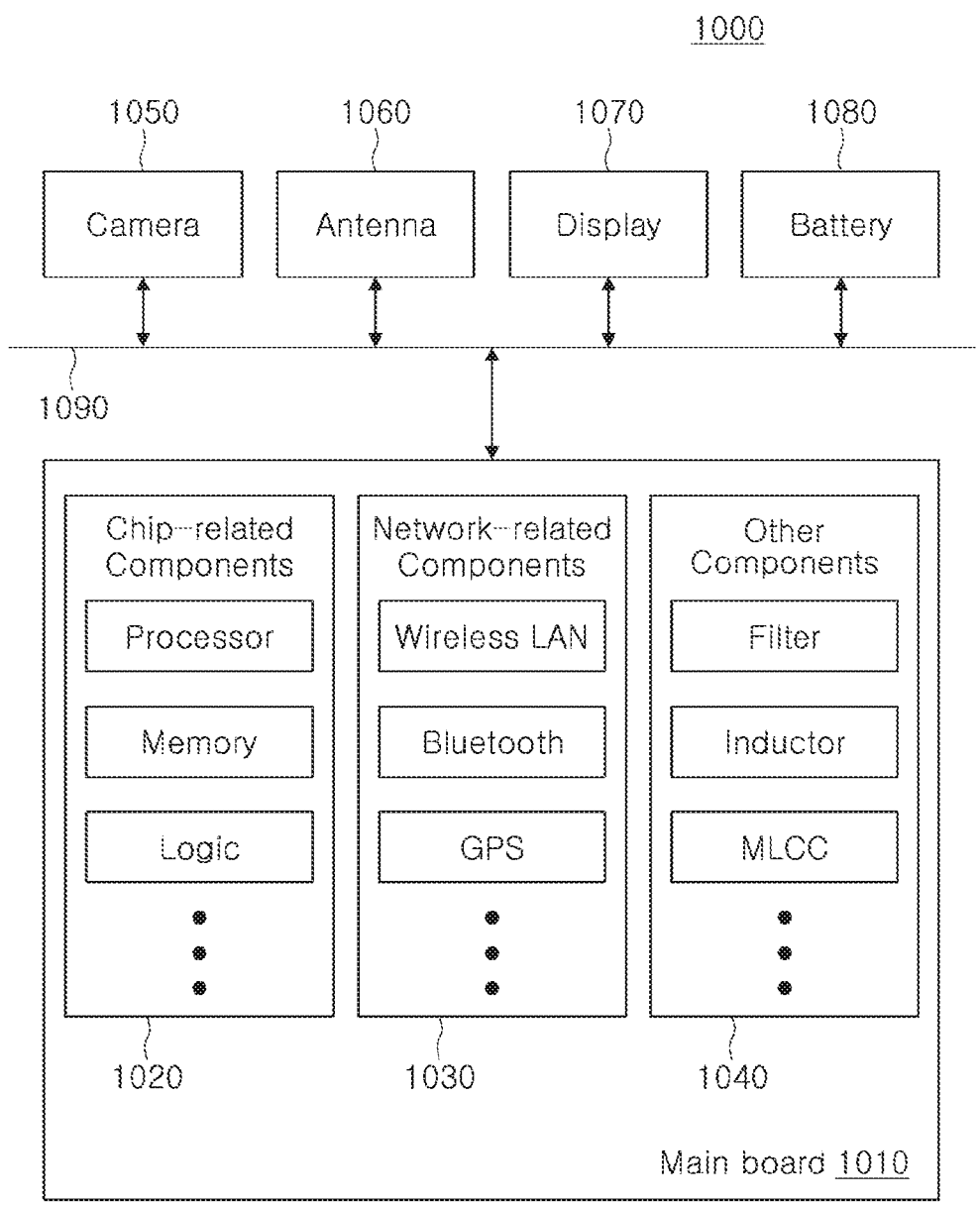
FIG. 1 is a block diagram schematically showing an example of an electronic device system.

FIG. 1 is a schematic block diagram illustrating an example of an electronic device system.

Referring to FIG. 1, an electronic device 1000 may include a main board or motherboard 1010. The motherboard 1010 may include chip related components 1020, network related components 1030, other components 1040, or the like, physically or electrically connected thereto.

These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include components compatible with protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, and may also include components compatible with a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
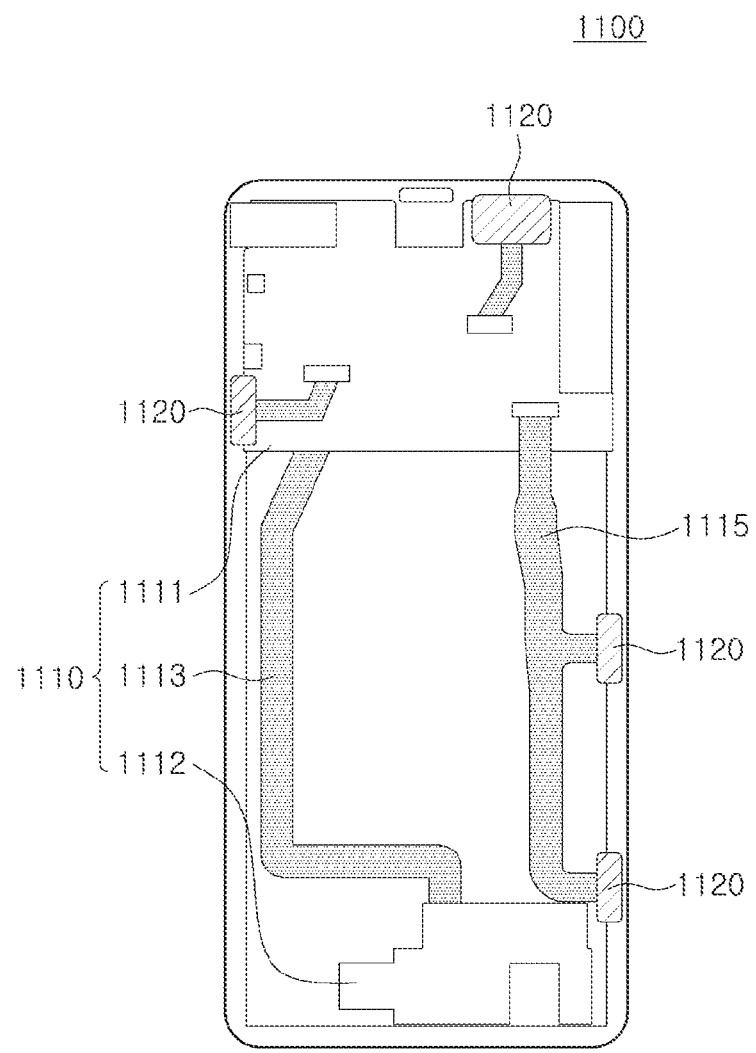
FIG. 2 is a perspective view schematically showing an example of an electronic device.

FIG. 2 is a schematic perspective view illustrating an example of an electronic device.

Referring to the drawings, the electronic device may be, for example, a smartphone 1100. A mainboard 1110 is accommodated inside the smartphone 1100. The mainboard 1110 may include a connection substrate 1113 connecting both a main substrate 1111 and a sub-substrate 1112. The mainboard 1110 may be a rigid-flexible printed circuit board (RFPCB). For example, the main substrate 1111 and the sub-substrate 1112 may be rigid substrates, and the connection substrate 1113 may be a flexible substrate. An antenna module 1120 for 5G communication may be disposed at various positions of the mainboard 1110. An additional substrate 1115 may be connected to the mainboard 1110, and various types of antenna modules 1120 may also be disposed on the additional substrate 1115. Various electronic components may be disposed on the mainboard 1110.

Figure 3:
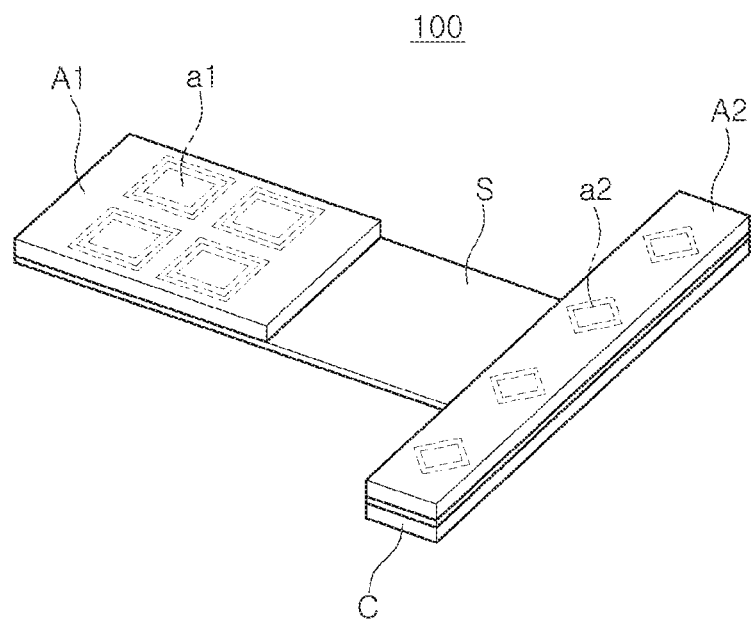
FIG. 3 is a perspective view schematically showing an example before a module is bent.

FIG. 3 is a perspective view schematically showing an example before a module is bent.

Figure 4:
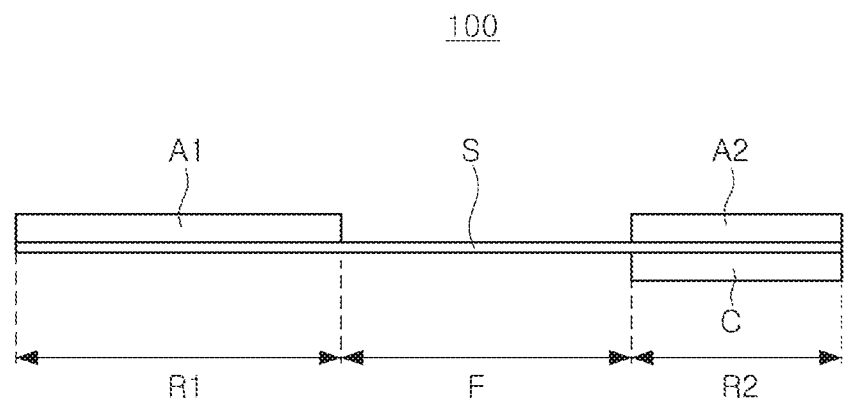
FIG. 4 is a schematic cross-sectional view of the module of FIG. 3.

FIG. 4 is a schematic cross-sectional view of the module of FIG. 3.

Figure 5:
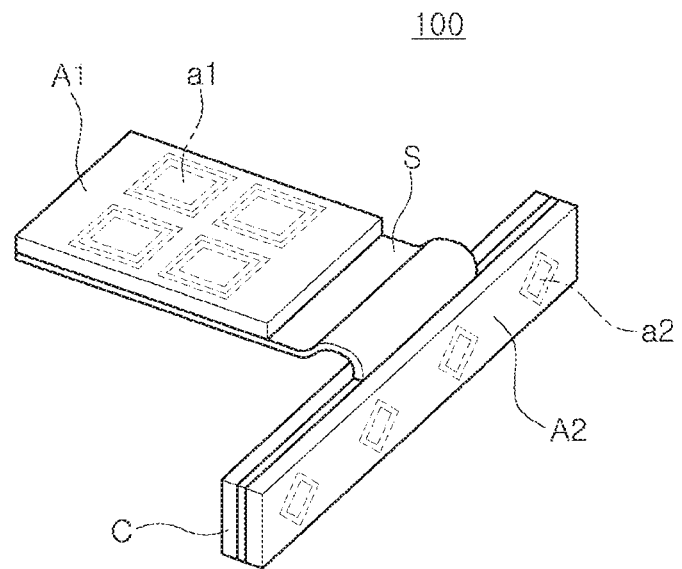
FIG. 5 is a perspective view schematically showing an example after a module is bent.

FIG. 5 is a perspective view schematically showing an example after a module is bent.

Figure 6:
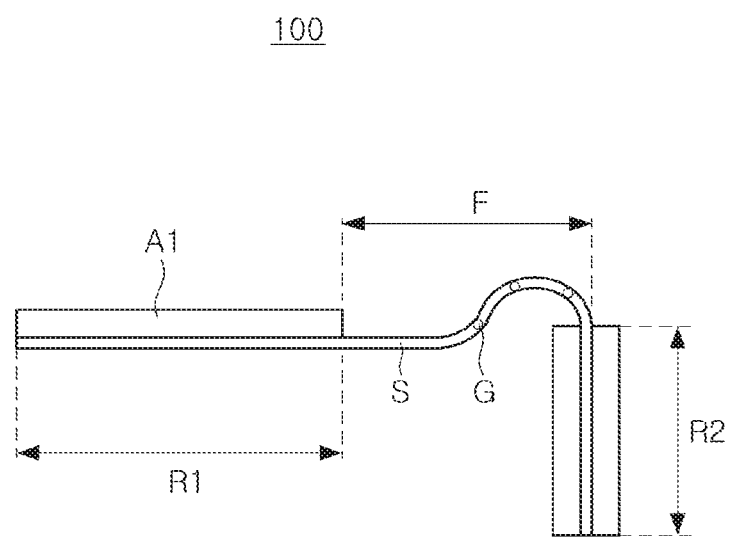
FIG. 6 is a schematic cross-sectional view of the module of FIG. 5.

FIG. 6 is a schematic cross-sectional view of the module of FIG. 5.

Referring to the drawings, a module 100 according to an example includes a printed circuit board S having rigid regions R1 and R2 and a flexible region F, a first antenna region A1 disposed on one side of the first rigid region R1 of the printed circuit board S, a second antenna region A2 disposed on one side of the second rigid region R2 of the printed circuit board S, and an electronic component region C disposed on another side of the second rigid region R2 of the printed circuit board S. For example, the module 100 according to an example may be an antenna module in which configurations (A1, A2) for implementing an antenna function are disposed on a printed circuit board S having a rigid (R1)-flexible (F)-rigid (R2) type and a configuration having various types of electronic components. However, the present disclosure is not limited thereto, and only one of the rigid regions R1 and R2 may be present. In addition, the antenna regions A1 and A2 may be omitted, and other configurations may be further disposed as necessary, so that other types of modules may be used. Meanwhile, rigid means relatively superior rigidity compared to flexible. In addition, flexible refers to those having superior bending properties relative to rigidity.

A cross-sectional structure of the RFPCB that can be applied to the printed circuit board S is not particularly limited, and may be a known cored type RFPCB having a relatively thick core layer therein, or formed through a coreless process, or may be a known coreless type RFPCB in which the core layer is omitted therefrom, as it is formed through a coreless process. That is, an internal cross-sectional structure is not particularly limited. The printed circuit board S may include a plurality of insulating layers, a plurality of wiring layers, and a plurality of via layers, in the rigid regions R1 and R2 and the flexible region F.

An insulating material may be used as a material of the insulating layer, and in this case, the insulating material may be a thermosetting resin such as an epoxy resin, a thermoplastic resin such as polyimide, or a material including a reinforcing material such as glass fiber (or glass cloth, glass fabric) and/or an inorganic filler, for example, prepreg, Ajinomoto Build-up Film (ABF), Photo Image-able Dielectric (PID), or the like may be used. However, the present disclosure is not limited thereto, and a glass plate may be used as a material of a specific insulating layer, or a ceramic plate may also be used. If necessary, it may include at least one of a liquid crystal polymer (LCP) having a low dielectric loss, polyimide (PI), a cyclo olefin polymer (COP), polyphenylene ether (PEP), polyether ether ketone (PEK), and PTFE, or a derivative thereof. When a plurality of insulating layers are used, a material of each of the insulating layers may be the same or different. When the plurality of insulating layers are used, a bonding layer may be disposed between each of the insulating layers. The bonding layer may include, for example, at least one of an epoxy-based resin having a low dielectric loss, PPE, and COP, or a derivative thereof.

A metal material may be used as a material of the wiring layer, and the metal material may include copper (Cu), aluminum (Al), silver (Ag), tin (Sn), gold (Au), nickel (Ni), lead (Pb), titanium (Ti), or alloys thereof. The wiring layer may perform various functions depending on a design of a corresponding layer. For example, the wiring layer may include a ground pattern, a power pattern, a signal pattern, and the like. Here, the signal pattern includes various signals except for those of the ground pattern, the power pattern, and the like, such as an antenna signal and a data signal. These patterns may include a line pattern, a plane pattern, and/or a pad pattern.

A metal material can also be used as a material for the via layer, and the metal material may include copper (Cu), aluminum (Al), silver (Ag), tin (Sn), gold (Au), nickel (Ni), lead (Pb), titanium (Ti), or alloys thereof. A connection via of the via layer may be completely filled with a metal material, or the metal material may be formed along a wall surface of the via hole. In addition, all known shapes, such as a tapered shape, an hourglass shape, a cylindrical shape, and the like can be applied. The via layer may also perform various functions depending on the design of the corresponding layer. For example, connection vias for signal connection, connection vias for ground connection, connection vias for power connection, and the like may be included.

The antenna regions A1 and A2 may be integrated into the rigid regions R1 and R2 to form a portion of the printed circuit board S. For example, the rigid regions R1 and R2 may include a plurality of insulating layers, a plurality of wiring layers, and a plurality of via layers constituting the antenna regions A1 and A2, respectively. In this case, at least one of the plurality of wiring layers may include antenna patterns a1 and a2, respectively. The antenna patterns a1 and a2 may be patch antennas. Alternatively, it may be a combination of a patch antenna and a dipole antenna to improve signal transmission power. However, the present disclosure is not limited thereto, and the antenna regions A1 and A2 may be separate antenna members separated from the rigid regions R1 and R2. The antenna member may include a chip-type antenna, a package-type antenna, and the like. The antenna member may be disposed on the printed circuit board S in surface mounting form through a solder, or the like.

The electronic component region C may include various kinds of electronic components. For example, the electronic component region C may include a semiconductor chip, a passive element, or the like, and the semiconductor chip or the passive element may be disposed in surface mounting form on the printed circuit board S through a solder, or the like. Optionally, the electronic component region C may include a chip package including a semiconductor chip and/or a passive element, and the chip package may also be disposed in surface mounting form on the printed circuit board S through solder, or the like. The semiconductor chip may include a radio frequency integrated circuit (RFIC), but is not limited thereto, and may be another type of IC, such as a memory-related IC or a processor-related IC. The passive element may be a high-frequency inductor, a ferrite inductor, a power inductor, ferrite beads, LTCC, an EMI filter, MLCC, etc., but is not limited thereto.

Meanwhile, for EMI shielding, which becomes important recently, it may be considered to surround a wiring pattern formed for high-frequency signal transmission, and the like, with a conductor pattern and a conductive via as described below. In this case, a flexible region F of the printed circuit board S is not particularly problematic before a module 100 is bent, but after the module 100 is bent, via cracks may occur at a contact point between the conductor pattern and the conductive via in the partially bent region G of the flexible region F. The occurrence of the via cracks may increase resistance from the viewpoint of the electronic device, causing heat generation, and as a result, battery consumption may increase. The structure for preventing this will be described later.

Figure 7:
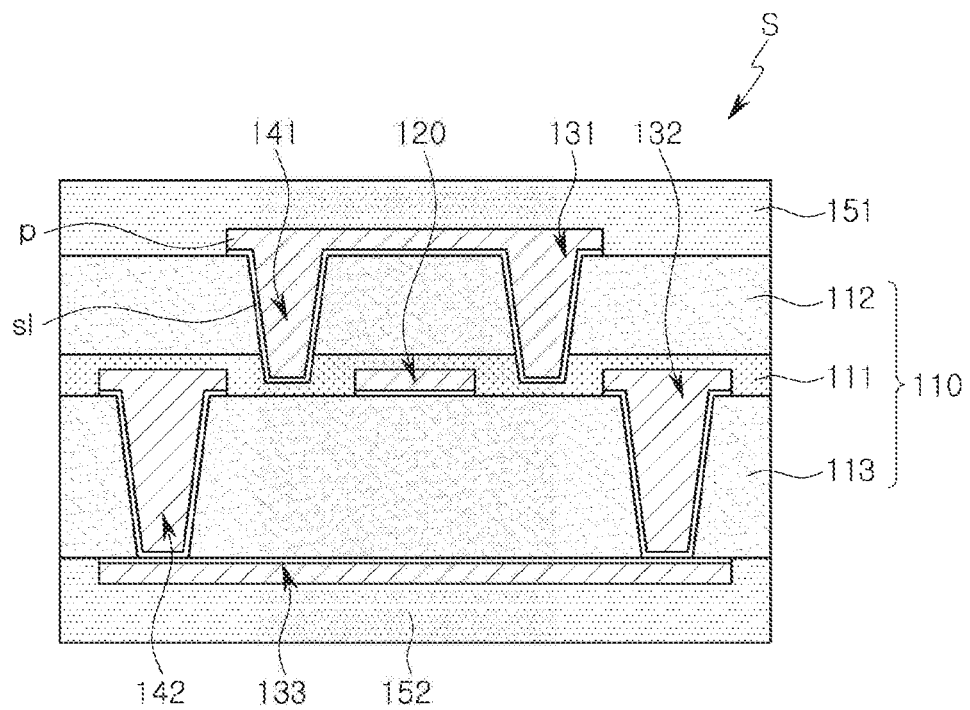
FIG. 7 is an enlarged cross-sectional view schematically showing a region G of FIG. 5.

FIG. 7 is an enlarged cross-sectional view schematically showing a region G of FIG. 6.

Figure 8:
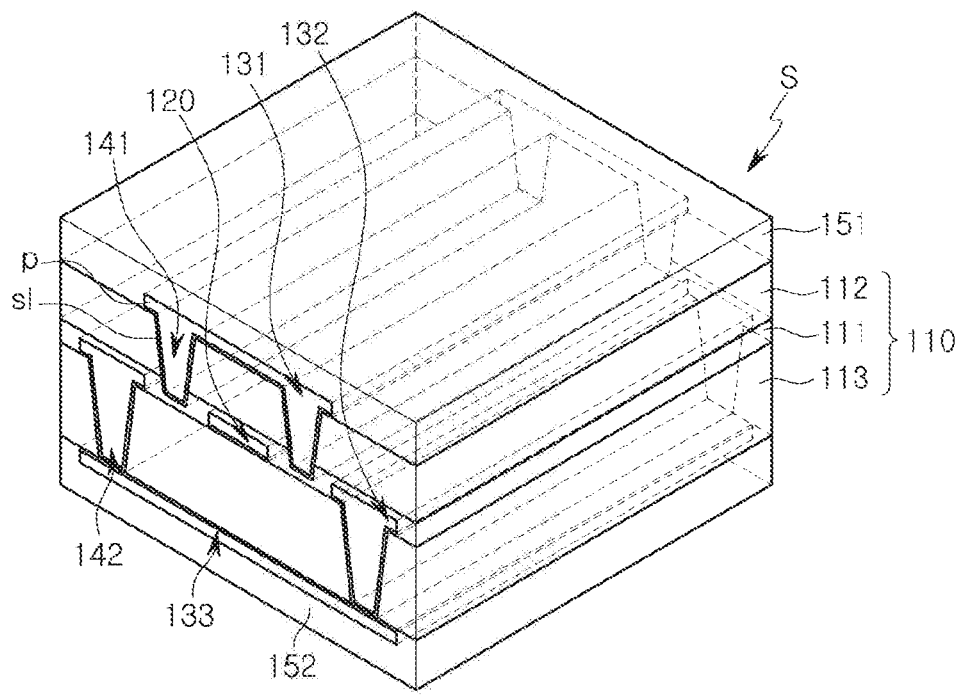
FIG. 8 is a perspective view according to another example of the region G of FIG. 7.

FIG. 8 is a perspective view according to an example of the region G of FIG. 7.

Figure 9:
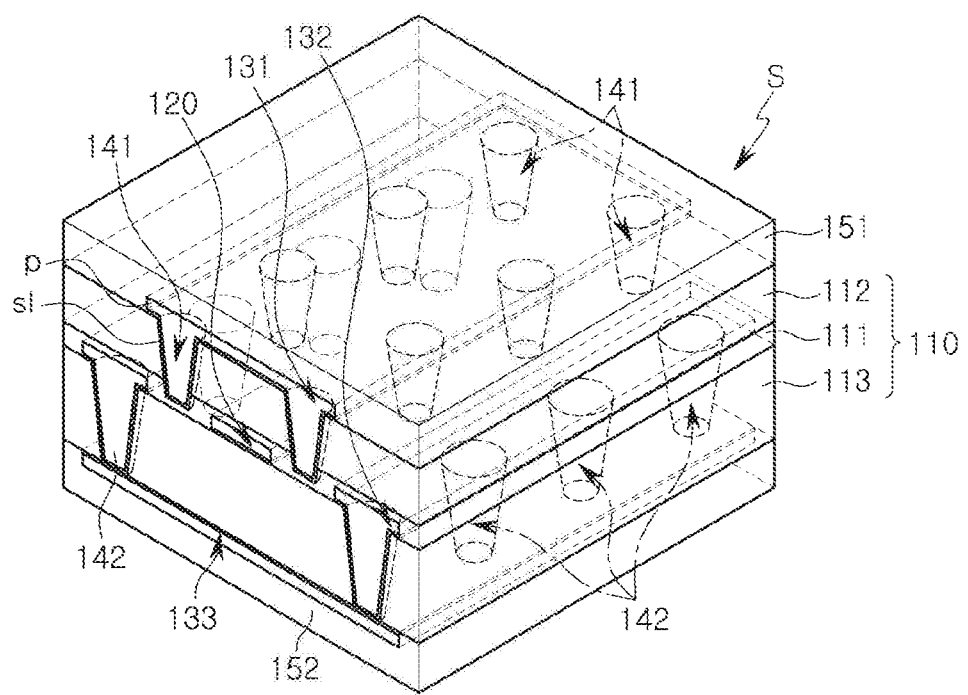
FIG. 9 is a perspective view according to another example of the region G of FIG. 7.

FIG. 9 is a perspective view according to another example of the region G of FIG. 7.

Referring to the drawings, the printed circuit board S includes an insulating body 110, a wiring pattern 120 embedded in the insulating body 110, a first conductor pattern 131 disposed on the insulating body 110, and covering at least a portion of the wiring pattern 120 on a plane, and a first conductive via 141 penetrating a portion of the insulating body 110, and disposed to surround at least a portion of the wiring pattern 120 on a plane. The wiring pattern 120 may have a line-shaped pattern. The first conductor pattern 131 may have a plane-shaped pattern. At least a portion of the wiring pattern 120 may be surrounded by the first conductor pattern 131 and the first conductive via 141, and thus it may have an EMI shielding effect. The first conductive via 141 has an upper surface connected to the first conductor pattern 131 and a lower surface connected to the insulating body 110. The first conductive via 141 may have a lower surface in contact with the insulating body 110. Therefore, the printed circuit board S may be free from via cracks during bending.

The printed circuit board S may further include a second conductor pattern 132 embedded in the insulating body 110 and disposed side by side with the wiring pattern 120. The second conductor pattern 132 may be a pad-shaped pattern. At least a portion of the wiring pattern 120 may be surrounded by the first conductor pattern 131, the first conductive via 141, and the second conductor pattern 132, and thus, may have a better EMI shielding effect. The second conductor pattern 132 may be disposed to be disconnected from the first conductive via 141. For example, central axes of each of the first conductive via 141 and the second conductor pattern 132 may be disposed to be staggered from each other. In addition, central axes of each of the first conductive via 141 and the second conductive via 142, which is described later, may also be disposed to be staggered from each other. In addition, a lower surface of the first conductive via 141 may be disposed between a side surface of the wiring pattern 120 and a side surface of the second conductor pattern 132. Through the disposition, the printed circuit board S can be freer from via cracks that may occur when bending.

The printed circuit board S may further include a third conductor pattern 133 disposed on an opposite side of a side where the first conductor pattern 131 of the insulating body 110 is disposed, and covering at least a portion of the wiring pattern 120 on a plane, and a second conductive via 142 penetrating another portion of the insulating body 110, and disposed to surround at least a portion of the wiring pattern 120 on a plane. The second conductive via 142 may connect second and third conductor patterns 132 and 133. The third conductor pattern 133 may be a plain-shaped pattern. The first to third conductor patterns 131, 132, and 133 and the first and second conductive vias 141 and 142 may form a shielding structure surrounding at least a portion of the wiring pattern 120. Since the shielding structure can mostly surround four directions of a signal transmission path of the wiring pattern 120, it can have a better EMI shielding effect.

The wiring pattern 120 may include a radio frequency signal pattern. The first to third conductor patterns 131, 132, and 133 may each include ground patterns. The first and second conductive vias 141 and 142 may each include ground vias. Since the first conductor pattern 131 and the second and third conductor patterns 132 and 133 are disconnected in a bent region G, upper and lower ground connections can be avoided. In this case, static electricity generation, and the like can be suppressed in terms of signal transmission, and stability of signal transmission can be improved by reducing noise.

The wiring pattern 120 and the first to third conductor patterns 131, 132, and 133 and the first and second conductive vias 141 and 142 may include a seed layer sl and a plating layer p, respectively. The seed layer sl may have a very thin thickness compared to the plating layer p. The seed layer sl may include copper (Cu) and/or titanium (Ti). The seed layer sl may be formed by electroless plating. The plating layer p may include copper (Cu). The plating layer p may be formed by electroplating.

Each of the first and second conductive vias 141 and 142 may have a line via shape, as shown in FIG. 8. Alternatively, each of the first and second conductive vias 141 and 142 may have a form of a plurality of hole vias disposed to be adjacent to each other, as shown in FIG. 9. As described above, the first and second conductive vias 141 and 142 may have a form that can surround most of the wiring pattern 120, and are not limited to the structure illustrated in the drawings, and may also have other possible shapes to achieve this purpose.

An insulating body 110 may include a first resin layer 111 including a thermosetting resin, and a second resin layer 112 disposed on the first resin layer 111 and containing a thermoplastic resin. The wiring pattern 120 may be embedded in the first resin layer 111. The first conductor pattern 131 may be disposed on the second resin layer 112. The first conductive via 141 may penetrate the second resin layer 112 and may further penetrate a portion of the first resin layer 111. Through the disposition of the multilayer resin layers 111 and 112, it is possible to provide an insulating body 110 that is flexible and advantageous for high-frequency signal transmission, and has excellent adhesion.

The insulating body 110 may include a third resin layer 113 disposed on an opposite side of the first resin layer 111 from a side thereof where the second resin layer 112 is disposed, and the third resin layer 113 may contain a thermoplastic resin. The second conductor pattern 132 may be embedded in the first resin layer 111. The third conductor pattern 133 may be disposed on the third resin layer 113. The second conductive via 142 may penetrate the third resin layer 113. Through this, it is possible to provide an insulating body 110 that is more flexible and is advantageous for more high-frequency signal transmission, and has better adhesion.

As the thermoplastic resin layer 111, for example, in terms of high-frequency signal transmission, polyphenylene ether (PPE), modified polyimide (PI), modified epoxy, and the like, may be used. A dielectric dissipation factor may be adjusted, according to the type of resins of the thermoplastic resin layer 111, the type of fillers contained in the resin, the content of the filler, or the like. Here, the dielectric dissipation factor is a value for a dielectric loss, and the dielectric loss means loss power generated when an alternating electric field is formed in the resin layer (a dielectric). The dielectric dissipation factor is proportional to the dielectric loss, and the smaller the dielectric dissipation factor, the smaller the dielectric loss. The thermoplastic resin layer 111 having low dielectric loss characteristics is advantageous in terms of loss reduction in high-frequency signal transmission. The dielectric dissipation factor of the thermoplastic resin layer 111 may be 0.003 or less, for example, 0.002 or less. In addition, the dielectric constant of the thermoplastic resin layer 111 may be 3.5 or less.

As the thermoplastic resin layers 112 and 113, for example, in terms of high-frequency signal transmission, a liquid crystal polymer (LCP), polytetrafluoroethylene (PTFE), polyphenylene sulfide (PSP), polyphenylene ether (PPE), polyimide (PI), or the like can be used. A dielectric dissipation factor (Df) may be adjusted according to the type of resins of the thermoplastic resin layers 112 and 113, the type of fillers contained in the resin, the content of the filler, and the like. Here, the dielectric dissipation factor is a value for a dielectric loss, and the dielectric loss means loss power generated when an alternating electric field is formed in the resin layer (a dielectric). The dielectric dissipation factor is proportional to the dielectric loss, and the smaller the dielectric dissipation factor, the smaller the dielectric loss. The thermoplastic resin layers 112 and 113 having low dielectric loss properties are advantageous in terms of loss reduction in high-frequency signal transmission. The dielectric dissipation factor of the thermoplastic resin layers 112 and 113 may be 0.003 or less, for example, may be 0.002 or less. In addition, the dielectric constants (Dk) of the thermoplastic resin layers 112 and 113 may be 3.5 or less.

The thickness of each of the thermoplastic resin layers 112 and 113 may be thicker than that of the thermoplastic resin layer 111. In terms of high-frequency signal transmission, it may be more desirable to have this thickness relationship. An interface between the thermoplastic resin layers 112 and 113 and the thermoplastic resin layer 111, which are vertically adjacent, may include a roughness surface. The roughness surface means a surface that has been roughened and having roughness. According to the roughness surface, the thermoplastic resin layers 112 and 113 and thermoplastic resin layer 111, which are vertically adjacent, can secure adhesion to each other. For example, surfaces of the thermoplastic resin layers 112 and 113 contacting the thermoplastic resin layer 111 may have higher roughness than surfaces of the thermoplastic resin layers 112 and 113 that do not contact the thermoplastic resin layer 111.

An insulating body 110 may further include a first passivation layer 151 disposed on the second resin layer 112 and covering at least a portion of the first conductor pattern 131. In addition, the insulating body 110 may further include a second passivation layer 152 disposed on the third resin layer 113 and covering at least a portion of the third conductor pattern 133. The first and second passivation layers 151 and 152 may function as protective layers, respectively. The first and second passivation layers 151 and 152 may be ABF. However, the present disclosure is not limited thereto, and the passivation layers 151 and 152 may be a known photosensitive insulating layer, for example, a solder resist (SR) layer.

As set forth above, according to the present disclosure, a printed circuit board capable of EMI shielding for a wiring pattern and a module including the same can be provided.

As another effect of various effects of the present disclosure, a printed circuit board that can prevent cracking of a via even when a substrate is bent and a module including the same can be provided.

As another effect of various objects of the present disclosure, it is possible to provide a printed circuit board which can reduce signal loss by suppressing generation of static electricity and a module including the same.

Throughout the specification, it will be understood that when an element, such as a layer, region, or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that although the terms first, second, third, etc. may be used herein to describe various members, components, regions, layers, and/or sections, these members, components, regions, layers, and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the exemplary embodiments.

Spatially relative terms, such as "above," "upper," "below," and "lower" and the like, may be used herein for ease of description to describe one element's positional relationship relative to other element (s) in the orientation illustratively shown in the figures. It will be understood that the spatially relative terms are intended to encompass different orientations of the device in use or operation in addition to the orientation depicted in the figures. For example, if the device in the figures is turned over, elements described as "above" or "upper" relative to other elements would then be oriented "below" or "lower" relative to the other elements or features. Thus, the term "above" can encompass both the above and below orientations depending on a particular direction of the figures and device. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

While exemplary embodiments have been shown and described above, it will be apparent to those skilled in the art that modifications and variations could be made without departing from the scope of the present invention as defined by the appended claims.

What is claimed is:

1. A printed circuit board, comprising:
    an insulating body;
    a wiring pattern embedded in the insulating body;
    a first conductor pattern disposed on the insulating body, and overlapping at least a portion of the wiring pattern in a first direction;
    first conductive vias each penetrating a portion of the insulating body, and respectively disposed on opposite sides of the wiring pattern, in a second direction orthogonal to the first direction, to surround at least a portion of the wiring pattern, and
    second conductor patterns embedded in the insulating body, and disposed on opposite sides of the wiring pattern in the second direction,
    wherein each first conductive via extends from the first conductor pattern in the first direction towards a level of the wiring pattern and has a first surface connected to the first conductor pattern, and a second surface, opposite to the first surface in the first direction, connected to the insulating body, and
    the first conductive vias and the second conductor patterns are disposed to be disconnected from each other.

2. The printed circuit board of claim 1, wherein central axes, extending in the first direction, of each of the first conductive vias and the second conductor patterns are disposed to be offset from each other in the second direction.

3. The printed circuit board of claim 2, wherein the second surface of each first conductive via is disposed between a closest side surface of the wiring pattern and a side surface of a corresponding second conductor pattern.

4. The printed circuit board of claim 1, further comprising:
    a third conductor pattern disposed on an opposite side of the insulating body that is opposite to a side having the first conductor pattern thereon, and overlapping at least a portion of the wiring pattern in the first direction; and
    second conductive vias each penetrating another portion of the insulating body, and respectively disposed on opposite sides of the wiring pattern in the second direction to surround at least a portion of the wiring pattern,
    wherein each second conductive via connects a respective second conductor pattern and the third conductor pattern.

5. The printed circuit board of claim 4, wherein central axes, extending in the first direction, of each of the first and second conductive vias are disposed to be offset from each other in the second direction.

6. The printed circuit board of claim 4, wherein the first, second, and third conductor patterns and the first and second conductive vias form a shielding structure surrounding at least a portion of the wiring pattern,
  the wiring pattern comprises a radio frequency signal pattern,
  the first, second, and third conductor patterns each comprise a ground pattern, and
  the first and second conductive vias each comprise a ground via.

7. The printed circuit board of claim 1, wherein the insulating body comprises a first resin layer including a thermosetting resin, and a second resin layer disposed on the first resin layer and including a thermoplastic resin,
  the wiring pattern is embedded in the first resin layer,
  the first conductor pattern is disposed on the second resin layer, and
  each first conductive via penetrates the second resin layer and a portion of the first resin layer.

8. The printed circuit board of claim 7, wherein the first resin layer comprises polyphenylene ether (PPE), and
  the second resin layer comprises a liquid crystal polymer (LCP).

9. The printed circuit board of claim 7, wherein the insulating body further comprises a third resin layer disposed on an opposite side of the first resin layer that is opposite to a side having the second resin layer thereon, and including a thermoplastic resin,
  the second conductor patterns are embedded in the first resin layer,
  a third conductor pattern is disposed on the third resin layer,
  second conductive vias penetrate the third resin layer, and
  the second conductive vias each connect a respective second conductor pattern and the third conductor pattern.

10. The printed circuit board of claim 9, wherein the first resin layer comprises polyphenylene ether (PPE), and
  the second and third resin layers each comprise a liquid crystal polymer (LCP).

11. The printed circuit board of claim 9, further comprising:
  a first passivation layer disposed on the second resin layer and covering at least a portion of the first conductor pattern, and
  a second passivation layer disposed on the third resin layer and covering at least a portion of the third conductor pattern.

12. The printed circuit board of claim 1, wherein the printed circuit board has a rigid region and a flexible region, and
  the flexible region comprises the insulating body, the wiring pattern, the first conductor pattern, and the first conductive vias.

13. The printed circuit board of claim 12, wherein the printed circuit board includes a plurality of rigid regions, and the flexible region connects the plurality of rigid regions.

14. A module, comprising:
  a printed circuit board having a rigid region and a flexible region connected to the rigid region; and
  an electronic component mounted on the rigid region,
  wherein the flexible region includes an insulating body, a wiring pattern embedded in the insulating body, a conductor pattern disposed on the insulating body, and conductive vias penetrating a portion of the insulating body,
  each conductive via extends from the conductor pattern in an extending direction towards a level of the wiring pattern and has a first surface connected to the conductor pattern, and a second surface, opposite to the first surface in the extending direction, connected to the insulating body,
  the conductor pattern and the conductive vias surround at least a portion of the wiring pattern, and
  the second surface of each of the conductive vias is disposed at a level between top and bottom surfaces of the wiring pattern opposing each other in the extending direction.

15. The module of claim 14, further comprising an antenna region disposed on an opposite side of the rigid region from a side on which the electronic component is mounted on the rigid region,
  wherein the electronic component comprises a radio frequency integrated circuit (RFIC).

16. A printed circuit board comprising:
an insulating body;
a wiring pattern embedded in the insulating body;
first and third conductor patterns disposed on respective surfaces of the insulating body above and below the wiring pattern; and
first conductive vias extending downward from the first conductor pattern on opposite sides of the wiring pattern,
  wherein a lower end of each first conductive via is embedded exclusively in the insulating body to be spaced apart from the wiring pattern and all conductive patterns and conductive vias.

17. The printed circuit board of claim 16, further comprising:
  second conductor patterns embedded in the insulating body on opposite sides of the wiring pattern; and
  second conductive vias each extending downward from a respective second conductor pattern to the third conductor pattern,
  wherein the printed circuit board has a cross-sectional plane extending through each of the second conductor patterns, the first conductive vias, and the wiring pattern, and in which each of the second conductor patterns, the first conductive vias, and the wiring pattern are spaced apart from each other by portions of the insulating body.

18. The printed circuit board of claim 16, wherein the printed circuit board includes a flexible region and a rigid region having a higher rigidity than the flexible region, and
  the wiring pattern, the first and third conductor patterns, and the first conductive vias are disposed in the flexible region.

19. The printed circuit board of claim 16, wherein the first conductive vias are disposed on opposite sides of the wiring pattern in a first direction,
  the wiring pattern extends linearly in a second direction orthogonal to the first direction, and
  the first conductive vias include a first plurality of first conductive vias disposed linearly in the second direction on a first side of the wiring pattern, and a second plurality of first conductive vias disposed linearly in the second direction on a second side of the wiring pattern.

20. The printed circuit board of claim 17, wherein the second conductive vias include a third plurality of second conductive vias disposed linearly in the second direction on the first side of the wiring pattern, and a fourth plurality of second conductive vias disposed linearly in the second direction on the second side of the wiring pattern.

21. The printed circuit board of claim 1, wherein the first conductor pattern and the first conductive vias include a same seed layer.

22. The printed circuit board of claim 1, wherein the second surface of each of the first conductive vias is disposed at a level between top and bottom surfaces of the wiring pattern opposing each other in the first direction.

23. The printed circuit board of claim 1, wherein the second surface is completely in contact with the insulating body.

* * * * *